(12) United States Patent
Ng et al.

(10) Patent No.: US 8,951,841 B2
(45) Date of Patent: Feb. 10, 2015

(54) CLIP FRAME SEMICONDUCTOR PACKAGES AND METHODS OF FORMATION THEREOF

(75) Inventors: Melissa Mei Ching Ng, Melaka (MY); Mei Chin Ng, Melaka (MY); Peng Soon Lim, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 13/425,071

(22) Filed: Mar. 20, 2012

(65) Prior Publication Data

US 2013/0249067 A1  Sep. 26, 2013

(51) Int. Cl.
*H01L 21/00* (2006.01)
*H01L 23/495* (2006.01)

(52) U.S. Cl.
USPC ............ 438/112; 438/113; 438/110; 438/11; 257/670; 257/672

(58) Field of Classification Search
None
See application file for complete search history.

(56) References Cited

U.S. PATENT DOCUMENTS

| 6,075,289 | A | 6/2000 | Distefano | |
|---|---|---|---|---|
| 2003/0054591 | A1* | 3/2003 | Abe et al. | 438/111 |
| 2004/0065953 | A1 | 4/2004 | Kato | |
| 2006/0180904 | A1* | 8/2006 | Ong | 257/676 |
| 2008/0020511 | A1* | 1/2008 | Yang et al. | 438/110 |
| 2010/0102440 | A1* | 4/2010 | Yu et al. | 257/704 |
| 2010/0193920 | A1* | 8/2010 | Poh et al. | 257/676 |
| 2011/0121461 | A1* | 5/2011 | Lim et al. | 257/773 |

FOREIGN PATENT DOCUMENTS

| DE | 102010060798 A1 | 6/2011 |
|---|---|---|
| JP | 2002-110862 A | 4/2002 |
| WO | WO 2006/034393 A2 | 3/2006 |

OTHER PUBLICATIONS

Irving et al., "An EffectiveMethod for Improving IC Package Die Failure during Assembly Punch Processing", IEEE, 2005, pp. 227-233.*
Irving et al., "An Effective Method for Improving IC Package Die Failure during Assembly Punch Processing", 2005, 6th Int. Conf. on Thermal, Mechanical and Multiphysics Simulation and Experiments in Micro-Electronics and Micro-Systems, WuroSimE.*
Choi et al., Copper Lead Frame: An Ultimate Solution to the Reliability of BLP Package, Jan. 2000, IEEE Transactions on Electronics Packaging Manufacturing, vol. 23, No. 1.*
Theuss, H., et al., "A Highly Reliable Flip Chip Solution based on Electroplated AuSn Bumps in a Leadless Package," IEEE, 2005, pp. 272-279.
Wojnowski, M., et al., "Package Trends for Today's and Future mm-Wave Applications," The 38th European Microwave Conference, 2008, 55 pages.
"Recommendations for Printed Circuit Board Assembly of Infineon TSLP/TSSLP/TSNP Packages," Infineon, Jun. 2010, 19 pages.

* cited by examiner

*Primary Examiner* — Steven Loke
*Assistant Examiner* — Juanita B Rhodes
(74) *Attorney, Agent, or Firm* — Slater & Matsil, L.L.P.

(57) ABSTRACT

In one embodiment, a semiconductor package includes a clip frame with a first clip having a first support structure, a first lever, and a first contact portion, which is disposed on a front side of the semiconductor package. The first support structure is adjacent an opposite back side of the semiconductor package. The first lever joins the first contact portion and the first support structure. A first die is disposed over the first support structure of the first clip. The first die has a first contact pad on the front side of the semiconductor package. An encapsulant material surrounds the first die and the first clip.

30 Claims, 14 Drawing Sheets

CLIP FRAME SEMICONDUCTOR PACKAGES AND METHODS OF FORMATION THEREOF

TECHNICAL FIELD

The present invention relates generally to a semiconductor devices, and more particularly to clip frame semiconductor packages and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

Packaging may be a cost intensive process because of the complexity of connecting multiple electrical connections to external pads while protecting these electrical connections and the underlying chips.

SUMMARY OF THE INVENTION

These and other problems are generally solved or circumvented, and technical advantages are generally achieved, by illustrative embodiments of the present invention.

In one embodiment, a semiconductor package includes a clip frame comprises a first clip having a first support structure, a first lever, and a first contact portion, which is disposed on a front side of the semiconductor package. The first support structure is adjacent an opposite back side of the semiconductor package. The first lever joins the first contact portion and the first support structure. A first die is disposed over the first support structure of the first clip. The first die has a first contact pad on the front side of the semiconductor package. An encapsulant material surrounds the first die and the first clip.

In one embodiment, a method of forming a semiconductor package comprises attaching a first die over a first clip of a clip frame. The first clip has a first support structure, a first lever, and a first contact portion. The first lever joins the first contact portion and the first support structure. The first clip and the first die are encapsulated with an encapsulating material. The clip frame in singulated to form the semiconductor package. After singulated semiconductor package, the first contact portion is disposed on a front side of the semiconductor package and the first support structure is adjacent an opposite back side of the semiconductor package.

In an alternative embodiment, a method of forming a semiconductor package comprises providing a first die having a bottom side and an opposite front side with first die contacts. The bottom side of the first die is attached over a first clip of a clip frame. The first clip has a first support structure, a first lever, and a first contact portion. The first lever connects the first contact portion with the first support structure. The clip frame with the die is placed over a carrier such that the front side of the first die and the first contact portion physically contact the carrier. The first clip and the first die are encapsulated with an encapsulating material extending from the front side of the first die and covering the first support structure. The encapsulating material is cured to form a package body. The package body is separated from the carrier to expose a surface of the first contact portion and a surface of the first die contacts of the first die.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2A-2D, illustrates a clip frame used in fabricating the semiconductor package in accordance with an embodiment of the invention, wherein FIG. 2A illustrates a projection view and FIG. 2B illustrates a cross-sectional view, and FIG. 2C illustrates a magnified top view, and wherein FIG. 2D illustrates a top view of the clip frame;

FIG. 3, which includes

FIG. 7, which includes FIGS. 7A and 7B, illustrates a semiconductor package during fabrication after curing the encapsulating material and removing the carrier in accordance with an embodiment of the invention, wherein FIG. 7A illustrates a cross-sectional view and wherein FIG. 7B illustrates a top view;

FIG. 9, which includes FIGS. 9A and 9B, illustrates the semiconductor package during fabrication after singulation of the clip frame in accordance with an embodiment of the invention, wherein FIG. 9A illustrates a cross-sectional view and wherein FIG. 9B illustrates a top view;

FIG. 10, which includes FIGS. 10A and 10B, illustrates a semiconductor package during fabrication after forming an encapsulating material in accordance with an alternative embodiment of the present invention, wherein FIG. 10A illustrates a cross-sectional view and wherein FIG. 10B illustrates a top view;

FIG. 11, which includes FIGS. 11A and 11B, illustrates a semiconductor package during fabrication after singulation in accordance with an alternative embodiment of the present invention, wherein FIG. 11A illustrates a cross-sectional view and wherein FIG. 11B illustrates a top view;

FIG. 12, which includes FIGS. 12A and 12B, illustrates a semiconductor package mounted over a clip frame in accordance with an alternative embodiment of the present invention, wherein FIG. 12A illustrates a cross-sectional view and FIG. 12B illustrates a top view;

FIG. 14, which includes FIGS. 14A and 14B, illustrates a semiconductor package having a plurality of dies mounted over a clip frame during fabrication in accordance with an alternative embodiment of the present invention, wherein FIG. 14A illustrates a cross-sectional view and FIG. 14B illustrates a top view;

FIG. 15, which includes FIG. 16, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In various embodiments, the present invention teaches forming semiconductor packages using very low cost processes thereby dramatically reducing the cost of packaging semiconductor devices. As will be described in detail, in various embodiments, as much as possible, multiple process steps are combined to reduce manufacturing costs. Accordingly embodiments of the invention use a novel clip frame thereby obviating the need for wire bonding, etching a thick copper leadframe, and other processes.

A structural embodiment of a semiconductor package will be described using FIG. 1. Further structural embodiments will be described using FIGS. 12-14. A structural embodiment of a clip frame used in forming the semiconductor package will be described using FIGS. 1, 15, and 16. A method of fabricating the semiconductor package in accordance with an embodiment of the invention will be described using FIGS. 2-9. Further embodiments of fabricating the semiconductor package will be described using FIGS. 10-11, FIG. 13, and FIG. 14.

FIG. 1 illustrates a cross-sectional view of a semiconductor device formed using embodiments of the invention.

Figure 1A:
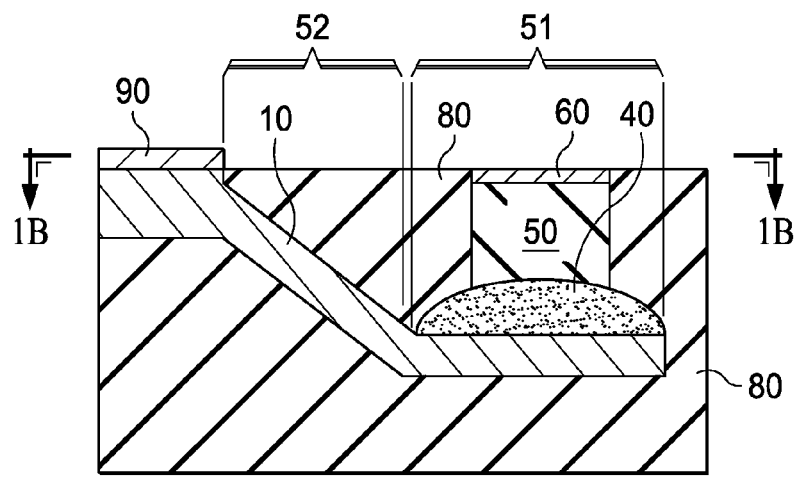
FIG. 1 illustrates a cross-sectional view of a semiconductor device formed using embodiments of the invention.

Referring to FIG. 1A, the semiconductor package comprises at least one dies 50 embedded within an encapsulating material 80. The die 50 is disposed over a clip 10, which also form contact pads 90 for the semiconductor package. The clip 10 has an angled structure (lever 52) extending from the bottom of the package where it forms a support structure 51 for the die 50 to a top portion, which forms the contact pads 90. In various embodiments, the die 50 may be attached to the support structure 51 of the clip 10 using an adhesive 40, which may be any suitable material that fixes the die 50 to the clip 10. The adhesive 40 may be a conductive adhesive allowing contact to the back side of the die 50. The die 50 has die contacts 60 on the front side. The die contacts 60 may comprise a conductive material and may comprise gold, tin, copper, aluminum, silver, nickel, platinum, and combinations thereof.

Figure 1B:
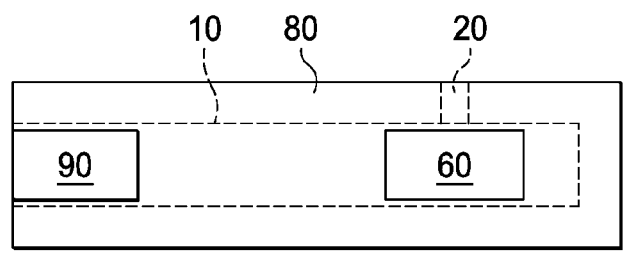

A top sectional view of the semiconductor package is illustrated in FIG. 1B. As illustrated in FIG. 1B, the clip is visible on the top surface at the contact pads 90. The package may also include a partial support beam 20 coupled to the clip 10. The supporting beam 20 is used during the fabrication and is broken during singulation as will be described in detail further.

Figure 2A:
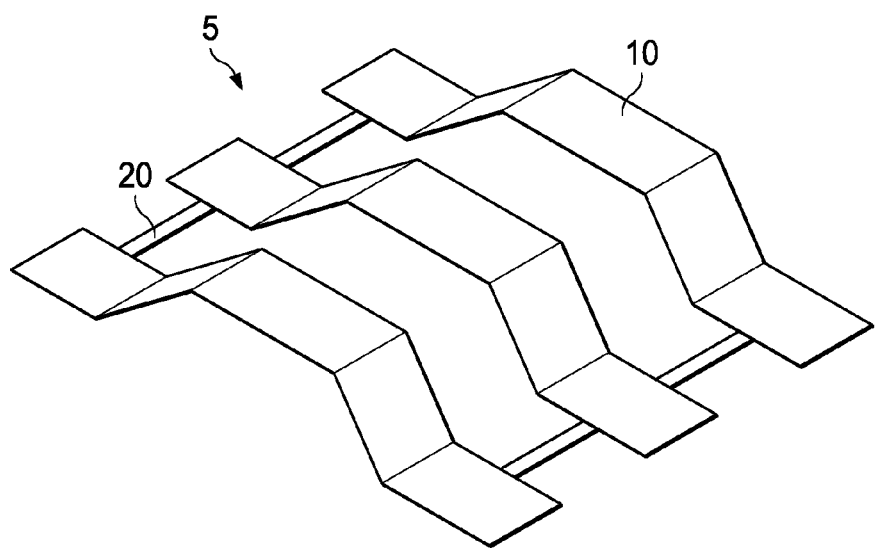
Figure 2B:
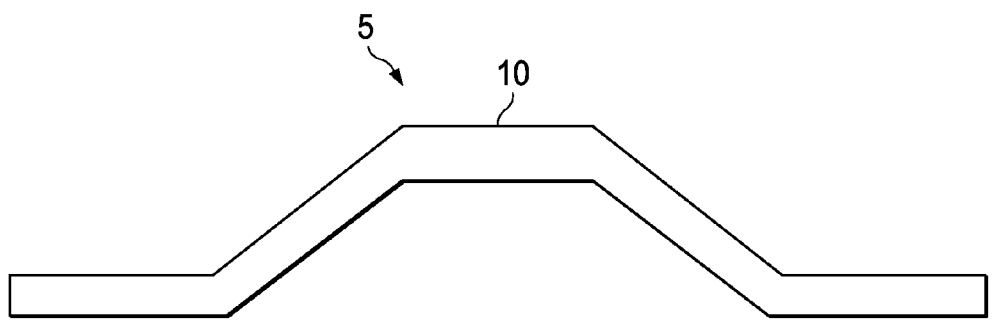
Figure 2C:
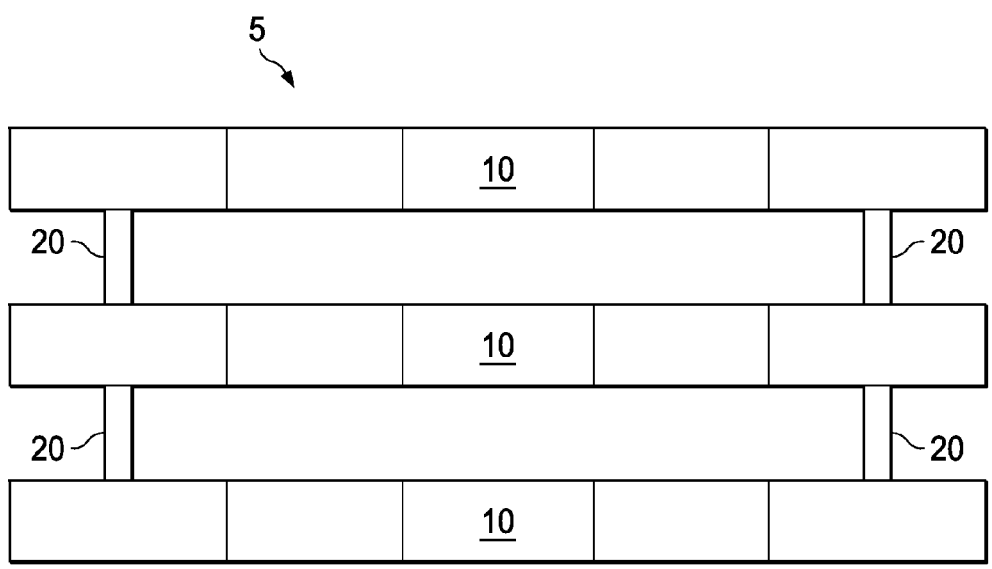
Figure 2D:
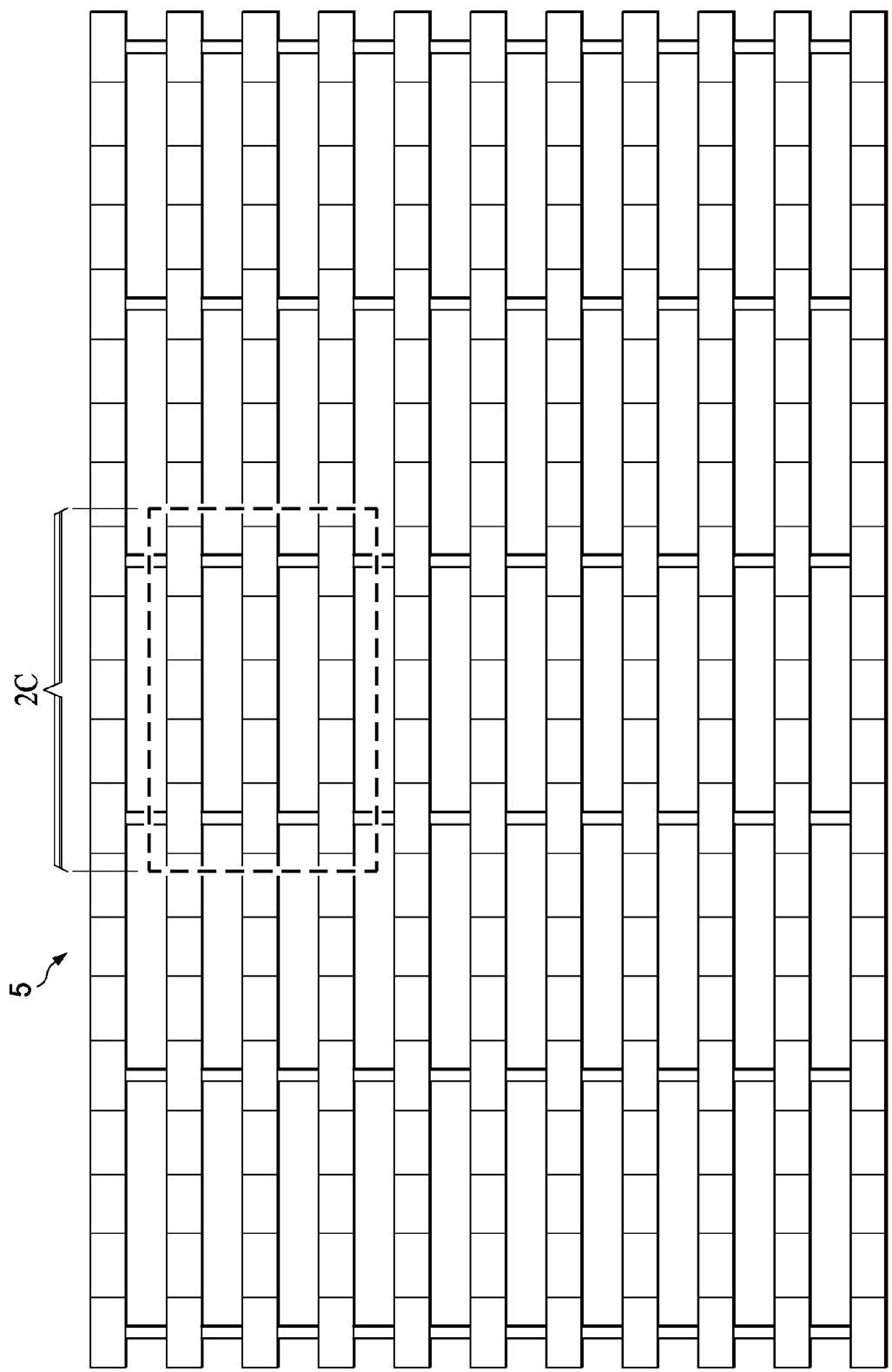

FIG. 2, which includes FIGS. 2A-2D, illustrates a clip frame used in fabricating the semiconductor package in accordance with an embodiment of the invention, wherein FIG. 2A illustrates a projection view and FIG. 2B illustrates a cross-sectional view, and FIG. 2C illustrates a magnified top view, and wherein FIG. 2D illustrates a top view of the clip frame.

Referring to FIG. 2, a clip frame 5 is used for the fabrication of the semiconductor package in various embodiments of the invention. The use of the clip frame 5 has many advantages. For example, wire bonding processes are avoided using embodiments of the invention. Further, the clips may function as part of the electrical circuitry and provide a ground plane. Similarly, the clips may provide functionality of a heat sink. The clip frame comprises a plurality of clips 10 oriented parallel to each other. The clips 10 are interconnected through support beams 20 thereby forming a clip frame 5. In various embodiments, the clip frame 5 may comprise any suitable shape, for example as illustrated in FIG. 15. Further, in various embodiments, the support beams 20 may be placed in any suitable location. In one embodiment, the support beams 20 may be centrally located or staggered as described in FIG. 16.

The clips 10 comprise a conductive material in various embodiments. In one or more embodiments, the clips 10 comprise copper, which may include pure copper that may contain trace impurities or copper alloys. Examples of clip frame material include copper, copper-aluminum, copper alloyed with nickel, iron, zinc, silicon, and others such as C19400, C70250, C19210. In some embodiments, the clip frame 5 may be comprised of a plurality of layers of different materials, for example, an outer high conductivity layer comprising relatively pure copper while comprising an inner layer of alloyed copper or other materials designed to provide mechanical stability. Pure metals such as pure copper may include trace impurities in various embodiments. In various embodiments, the clip frame material is the same material as a lead frame material.

As illustrated in FIG. 2D, the clip frame 5 may be a large frame structure formed by connecting a number of clips 10 by the support beams 20. The illustrations in FIG. 2A-2C and FIGS. 3-11 show a portion of the clip frame 5 during processing. In practice, a large number of dies may be packaged simultaneously reducing packaging costs.

Figure 3A:
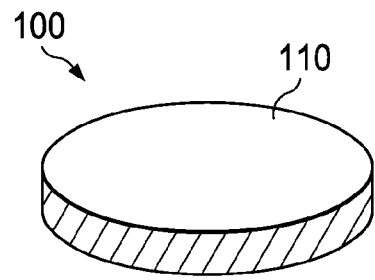
FIGS. 3A and 3B, illustrates the formation of the dies after wafer sawing or singulation in accordance with an embodiment of the invention.
Figure 3B:
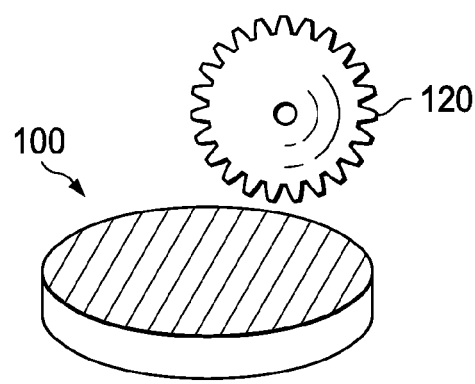

FIG. 3, which includes FIGS. 3A and 3B, illustrates the formation of the dies after wafer sawing or singulation in accordance with an embodiment of the invention.

After completion of all processing, the completed wafer may be singulated to form individual dies. The wafer 100 may be coated with a protective layer 110 as illustrated in FIG. 3A. Next, as illustrated in FIG. 3B, the wafer 100 may be singulated using, for example, a saw 120 to form individual chips or dies. The chips may be any type of semiconductor device and may comprise discrete devices or integrated circuits in one or more embodiments.

Figure 4:
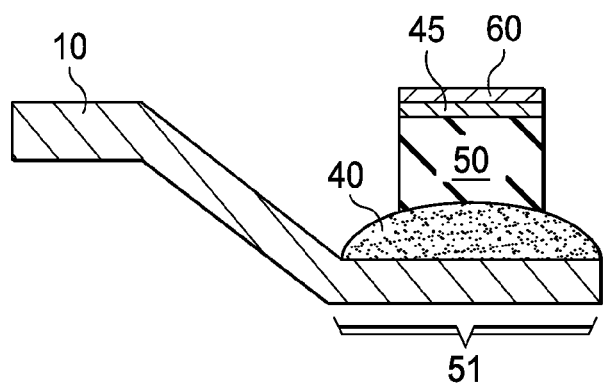
FIG. 4 illustrates a cross-sectional view of a semiconductor package during fabrication after the placement of dies over a clip frame in accordance with an embodiment of the invention.

FIG. 4 illustrates a cross-sectional view of a semiconductor package during fabrication after the placement of dies over a clip frame in accordance with an embodiment of the invention.

Referring to FIG. 4, the die 50 is placed over the support structure 51 of the clip 10. Similarly, other dies may be placed over other clips of the clip frame although not illustrated specifically. The die 50 may be attached to the clip 10 using an adhesive 40. The adhesive 40 may be any suitable adhesive. In one embodiment, the adhesive 40 may be an electrically conductive adhesive layer. In other embodiments, the adhesive 40 may be an insulating adhesive, a soft solder or a nano die attach.

In one embodiment, the adhesive 40 comprises a polymer such as a cyanide ester or epoxy material and may comprise silver particles. In one embodiment, the adhesive 40 may be applied as conductive particles in a polymer matrix so as to form a composite material after curing. In an alternative embodiment, a conductive nano-paste such as a silver nano-paste may be applied. Alternatively, in another embodiment, the adhesive 40 comprises a solder such as lead-tin material. In various embodiments, any suitable conductive adhesive material including metals or metal alloys such as aluminum, titanium, gold, silver, copper, palladium, platinum, nickel, chromium or nickel vanadium, may be used to form the adhesive 40.

The adhesive 40 may be dispensed in controlled quantities under the die 50. An adhesive 40 having a polymer may be cured at about 125° C. to about 200° C. while solder based adhesive 40 may be cured at 250° C. to about 350° C. Using the adhesive 40, the die 50 is attached to the support structure 51 of the clip 10.

The front side of the die 50 is coated with a metallic layer 45 to form die contacts 60. The metallic layer 45 comprises an aluminum tin alloy in one embodiment. In one embodiment, the metallic layer 45 may comprise a suitable material for eutectic bonding. In other embodiments, the metallic layer 45 comprises Al—Ge, Au—Ge, Au—In and/or Cu—Sn. The metallic layer 45 may be used for subsequent mounting on a circuit board, e.g., for forming solder balls.

Figure 5:
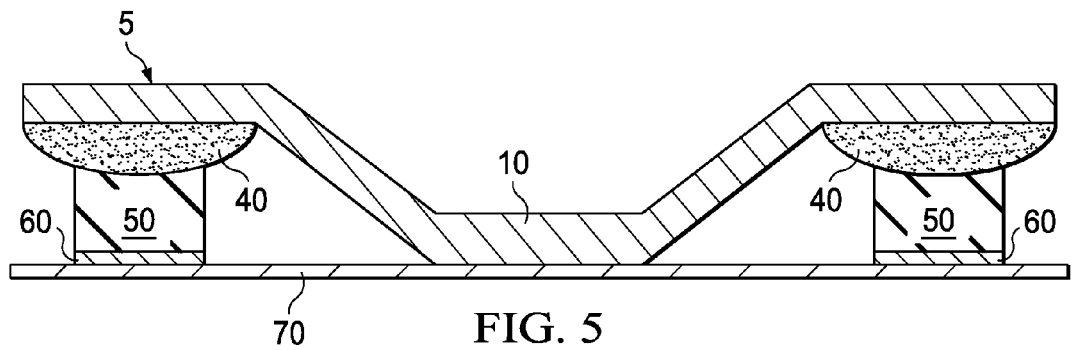
FIG. 5 illustrates a cross-sectional view of a semiconductor package during fabrication after placing the clip frame with the dies over a carrier in accordance with an embodiment of the invention.

FIG. 5 illustrates a cross-sectional view of a semiconductor package during fabrication after placing the clip frame with the dies over a carrier in accordance with an embodiment of the invention.

Referring to FIG. 5, the die with the clip frame is placed over a carrier 70 such that the front side of the die 50 with the metallic layer 45 faces and contacts the carrier 70. Similarly, a portion of the clip 10 contacts the carrier 70. The carrier 70 provides mechanical support during subsequent processing. The carrier 70 may have at least one flat surface over which semiconductor chips may be placed. In one or more embodiments, the carrier 70 may be round or square-shaped although in various embodiments the carrier 70 may be any suitable shape. The carrier 70 may have any appropriate size in various embodiments. In some embodiments, the carrier 70 may include an adhesive tape, for example, a double sided sticky tape laminated onto the carrier 70. The carrier 70 may comprise a frame, which is an annular structure (ring shaped) with an adhesive foil in one embodiment. The adhesive foil may be supported along the outer edges by the frame in one or more embodiments. In alternative embodiments, the carrier 70 may be a plate made of a rigid material including metals, for example, a metal such as nickel, steel, or stainless steel, a laminate, a film, or a material stack.

Figure 6:
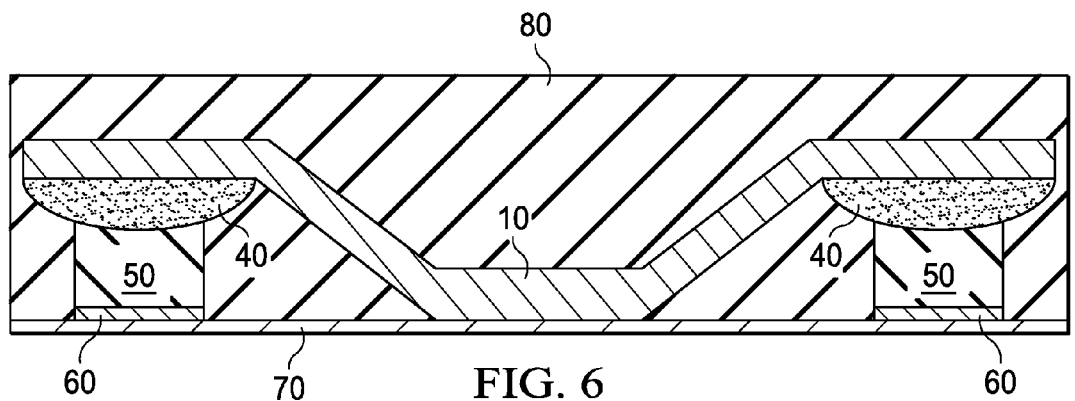
FIG. 6 illustrates a cross-sectional view of a semiconductor package during fabrication after encapsulating the clip frame and the dies in accordance with an embodiment of the invention.

FIG. 6 illustrates a cross-sectional view of a semiconductor package during fabrication after encapsulating the clip frame and the dies in accordance with an embodiment of the invention.

Referring to FIG. 6, an encapsulating material 80 is deposited over the clip frame 5. In various embodiments, the encapsulating material 80 is coated over the entire clip frame 5. The dies 50 are thereby embedded within the encapsulating material 80. In one embodiment, the encapsulating material 80 is applied using a compression molding process. In compression molding, the encapsulating material 80 may be placed into a molding cavity, then the molding cavity is closed to compress the encapsulating material 80. Compression molding may be used when a single pattern is being molded. In an alternative embodiment, the encapsulating material 80 is applied using a transfer molding process.

In other embodiments, the encapsulating material 80 may be applied using injection molding, granulate molding, powder molding, or liquid molding. Alternatively, the encapsulating material 80 may be applied using printing processes such as stencil or screen printing.

In various embodiments, the encapsulating material 80 comprises a dielectric material and may comprise a mold compound in one embodiment. In other embodiments, the encapsulating material 80 may comprise a polymer, a biopolymer, a fiber impregnated polymer (e.g., carbon or glass fibers in a resin), a particle filled polymer, and other organic materials. In one or more embodiments, the encapsulating material 80 comprises a sealant not formed using a mold compound, and materials such as epoxy resins and/or silicones. In various embodiments, the encapsulating material 80 may be made of any appropriate duroplastic, thermoplastic, or thermosetting material, or a laminate. The material of the encapsulating material 80 may include filler materials in some embodiments. In one embodiment, the encapsulating material 80 may comprise epoxy material and a fill material comprising small particles of glass or other electrically insulating mineral filler materials like alumina or organic fill materials.

The encapsulating material 80 may be cured, i.e., subjected to a thermal process to harden thus forming a hermetic seal protecting the dies 50, the adhesive 40, and the clip 10.

Figure 7A:
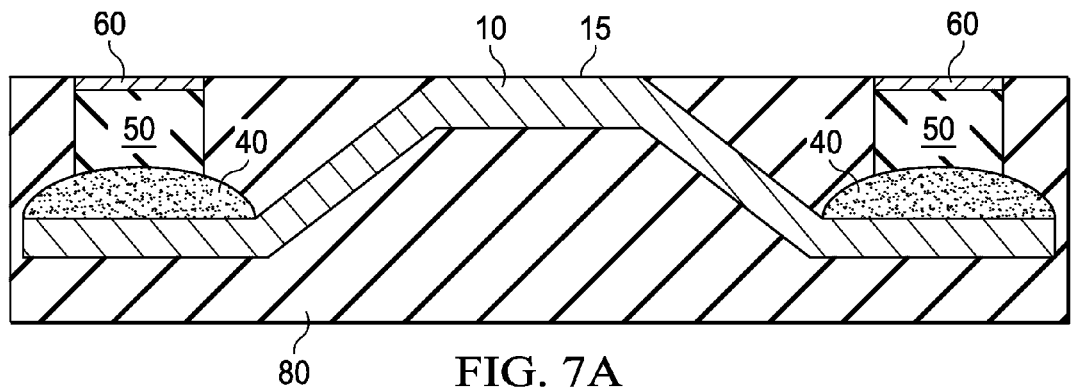
Figure 7B:
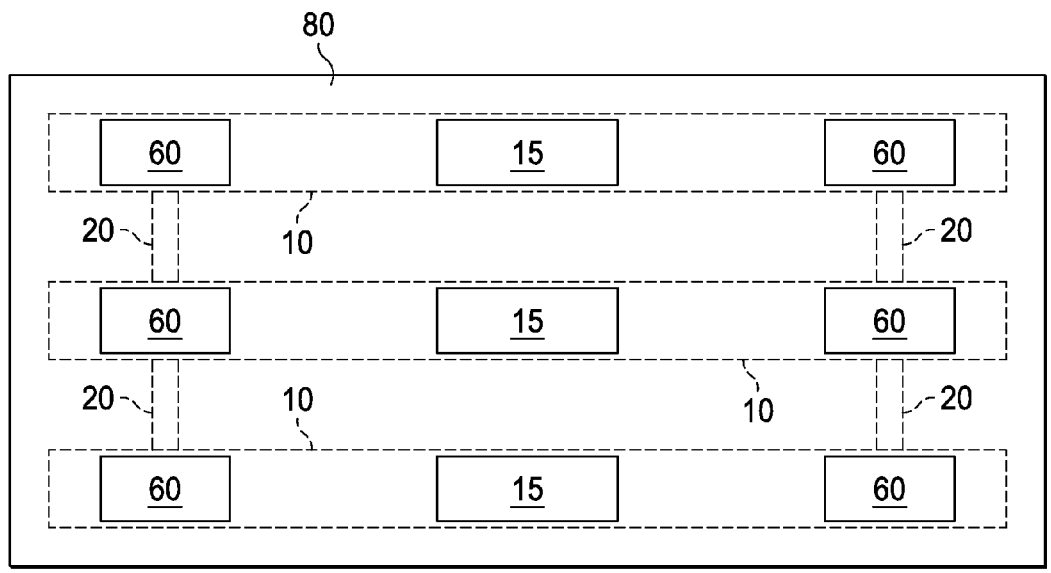

FIG. 7, which includes FIGS. 7A and 7B, illustrates a semiconductor package during fabrication after curing the encapsulating material and removing the carrier in accordance with an embodiment of the invention, wherein FIG. 7A illustrates a cross-sectional view and wherein FIG. 7B illustrates a top view.

Referring to FIG. 7, the clip 10 of the clip frame with the cured encapsulating material 80 may be separated from the carrier 70. As illustrated in FIGS. 7A and 7B, a portion (clip contact 15) of the clip 10, which was previously contacting the carrier 70 is exposed. Similarly, the die contacts 60 are also exposed.

As illustrated in FIG. 7B, in one embodiment, the encapsulating material 80 may be cover the entire surface of the clip frame 5 thus forming an encapsulated clip frame. In some embodiments, the encapsulating material 80 may be formed as a blanket material and in such embodiments may resemble artificial or reconstituted wafer.

Markings may be formed, e.g., using a laser marking process, on the encapsulating material 80 at this stage of processing. The markings may be used for future identification of the dies.

Figure 8:
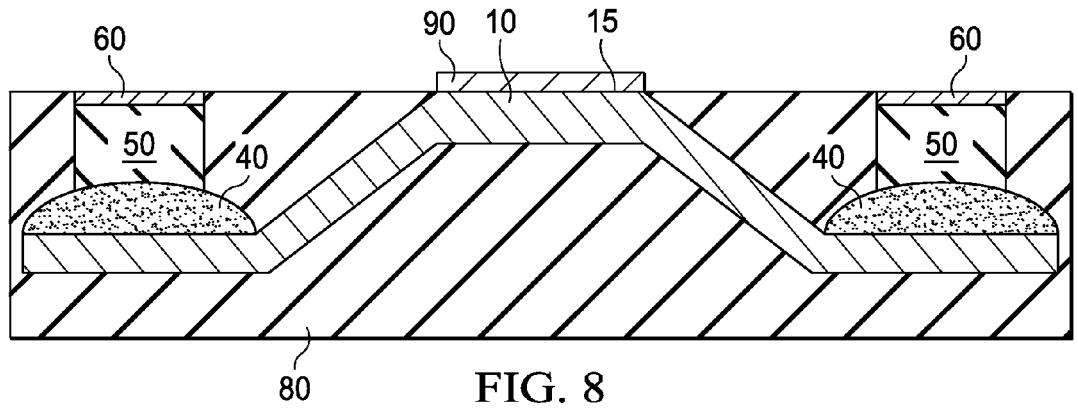
FIG. 8 illustrates a cross-sectional view of a semiconductor package during fabrication after plating the exposed pad portion of the clip frame in accordance with an embodiment of the invention.

FIG. 8 illustrates a cross-sectional view of a semiconductor package during fabrication after plating the exposed pad portion of the clip frame in accordance with an embodiment of the invention.

Referring to FIG. 8, the exposed surface of the clip 10 (clip contact 15) is plated to form contact pads 90. In some embodiments, the exposed die contacts 60 may also be plated. In one or more embodiments, exposed surface of the clip 10 (clip contact 15) is plated with silver in an electrolytic or electroless process. In alternative embodiments, exposed surface of the clip 10 (clip contact 15) is plated with Sn, Ni—Pd—Au, Ni—P—Au, Ag or any other solderable plating material.

In one embodiment, a barrier layer is deposited to prevent diffusion of metal atoms from the clip 10 followed by the deposition of a gold layer. The barrier layer may comprise nickel or cobalt in one or more embodiments. Both the barrier layer and the gold layer may be deposited using an electrolytic or electro-less deposition process. In one embodiment, nickel is plated first followed by gold or gold-nickel plating. In various embodiments, other metals and metal alloys including silver, tin, lead, nickel, gold, silver, copper, zinc, combinations thereof, and others may be plated. The contact pads 90 may comprise a plurality of layers in some embodiments.

In various embodiments, the plating process simultaneously plates all the contact pads 90 on the clip frame 5 thereby avoiding sequential processing for each package.

Figure 9A:
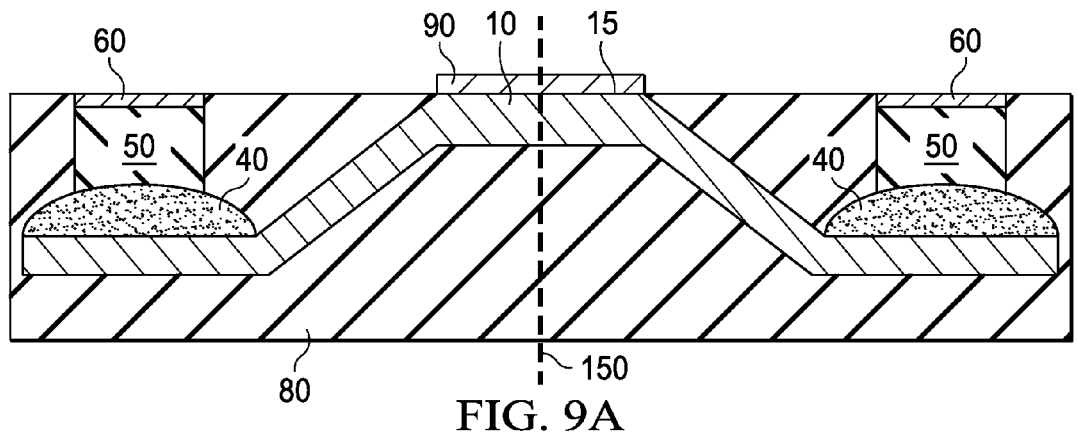
Figure 9B:
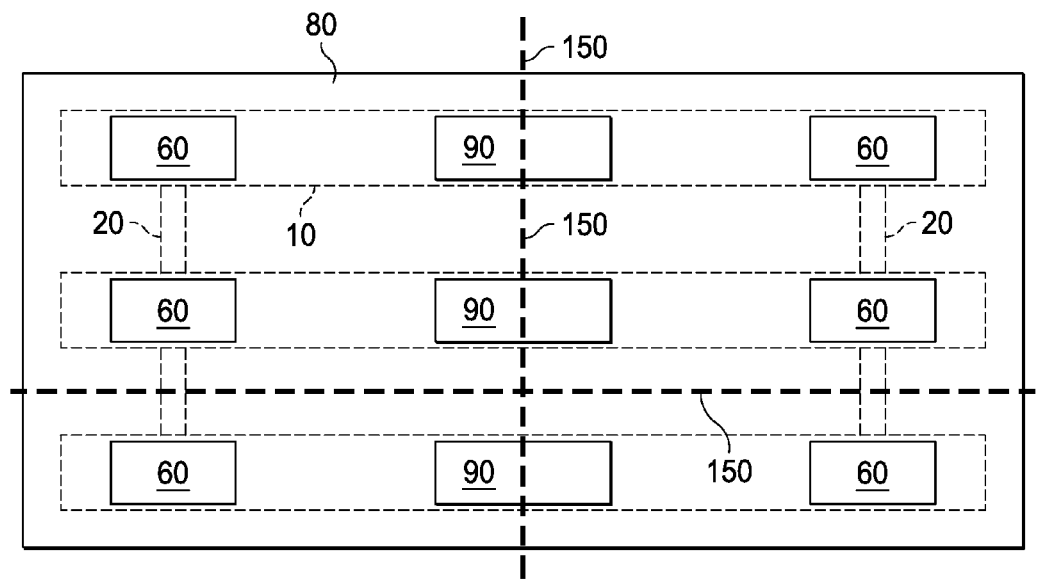

FIG. 9, which includes FIGS. 9A and 9B, illustrates the semiconductor package during fabrication after singulation of the clip frame in accordance with an embodiment of the invention, wherein FIG. 9A illustrates a cross-sectional view and wherein FIG. 9B illustrates a top view.

The encapsulated clip frame (e.g., reconstituted wafer) comprising the clip frame 5 and the dies 50 may be singulated to form a plurality of semiconductor packages. In one embodiment, a dicing saw 150 may be used to mechanical cut through the encapsulating material 80 and the clips 10. The dicing saw 150 may be used in a first direction to cut through the clip 10 and in a second direction to cut through the supporting beams 20 as illustrated in FIG. 9B.

FIGS. 10-11 illustrate fabricating the semiconductor package in accordance with an alternative embodiment of the present invention.

Unlike the prior embodiment, the encapsulating material 80 is not applied over the entire clip frame in this embodiment. Rather, the encapsulating material 80 is formed as patterns.

Figure 10A:
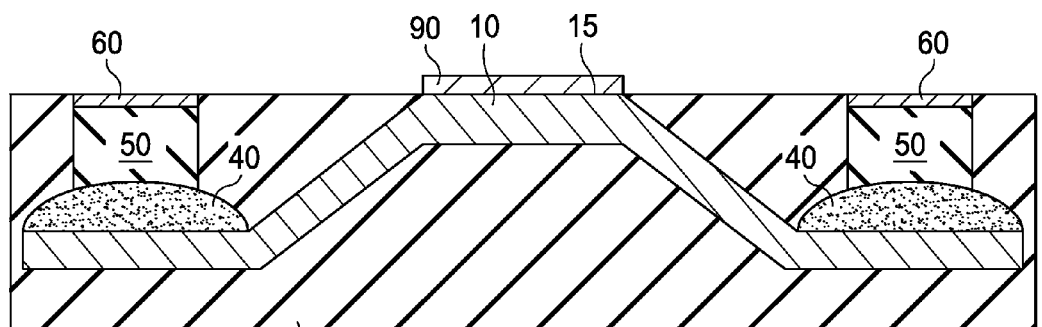
Figure 10B:
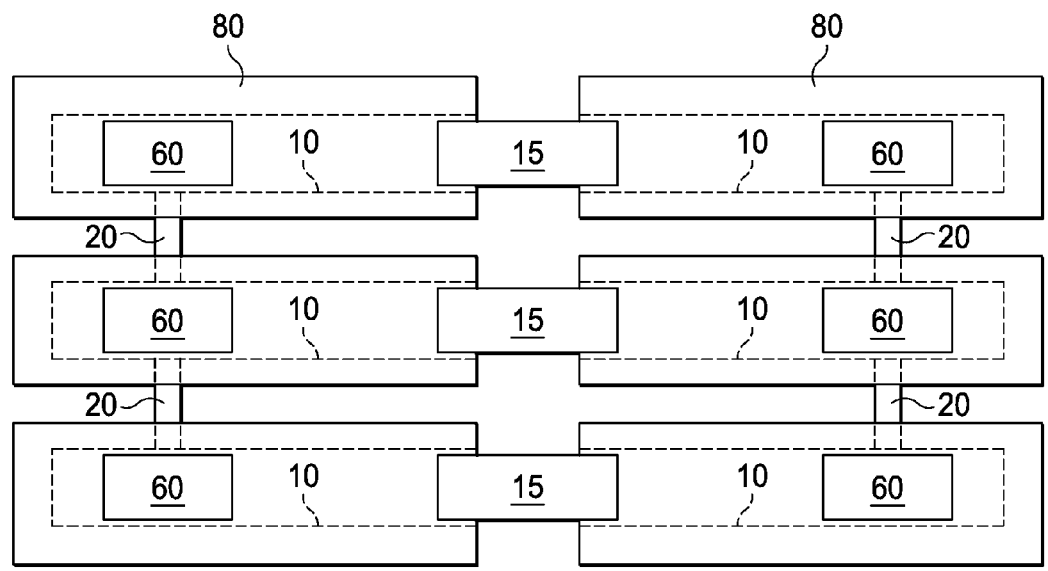

FIG. 10, which includes FIGS. 10A and 10B, illustrates a semiconductor package during fabrication after forming an encapsulating material in accordance with an alternative embodiment of the present invention, wherein FIG. 10A illustrates a cross-sectional view and wherein FIG. 10B illustrates a top view.

Processing begins in this embodiment as described in FIGS. 2-5. Referring to FIG. 10B, the encapsulating material 80 is formed as a plurality of islands or mesas over the dies 50. This may be accomplished by applying the encapsulating material 80 using molding, printing, or lamination. In various embodiments, the encapsulating material 80 may be applied using transfer molding process. In transfer molding, the molding cavity having the pattern is already closed, and the encapsulating material 80 is melted and transferred to the mold cavity along the runner, by pressure. In an alternative embodiment, the encapsulating material 80 is applied using a compression molding process.

In various embodiments, when many clips 10 are encapsulated together, either compression molding or transfer molding may be used. However, when a single cavity is filled (i.e., a single clip is encapsulated as illustrated in this embodiment), it is advantageous to use a transfer molding process rather than a compression molding process because compression molding will require too many cavities to be moving.

As illustrated in FIG. 10B, the encapsulating material 80 covers the die 50 while adjacent clips 10 are not joined together by the encapsulating material 80. In other words, adjacent clips 10 are joined only through the supporting beams 20. In some embodiments, the patterned encapsulating material 80 may be formed by a blanket deposition and curing process followed by a photo-lithography and etching process. However, this may result in more waste of the encapsulating material 80 and a molding process may be preferred.

Figure 11A:
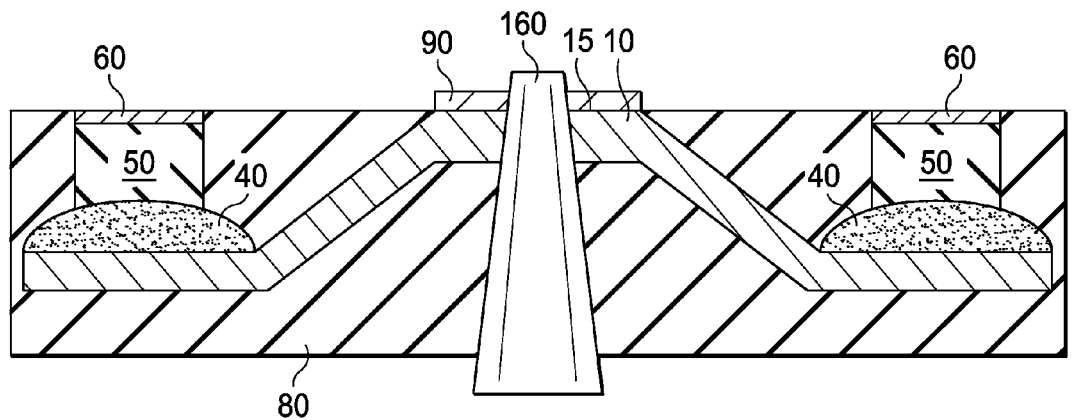
Figure 11B:
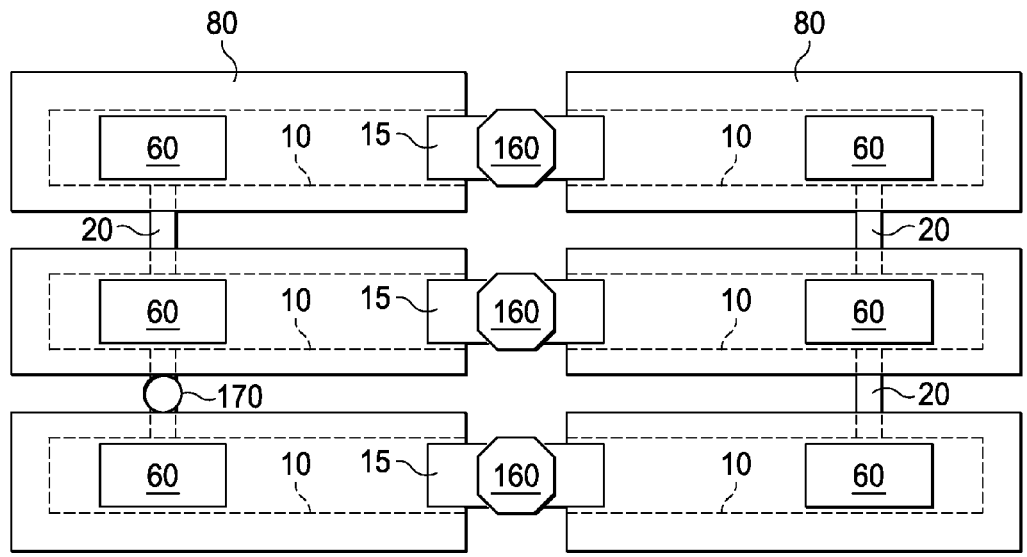

FIG. 11, which includes FIGS. 11A and 11B, illustrates a semiconductor package during fabrication after singulation in accordance with an alternative embodiment of the present invention, wherein FIG. 11A illustrates a cross-sectional view and wherein FIG. 11B illustrates a top view.

As described in prior embodiments, after curing the encapsulating material 80, the contact pads 90 are formed. Referring to FIGS. 11A and 11B, the exposed clip 10 and support beams 20 joining adjacent packages may be cut-off thereby singulating the clip frame into the plurality of packages. For example, in one embodiment, a mechanical stamping or punching process using stamp 160 may be used for the singulation step. The stamping tool 160 may have any suitable shape, for example, that minimizes mechanical issues such as delamination.

Figure 12A:
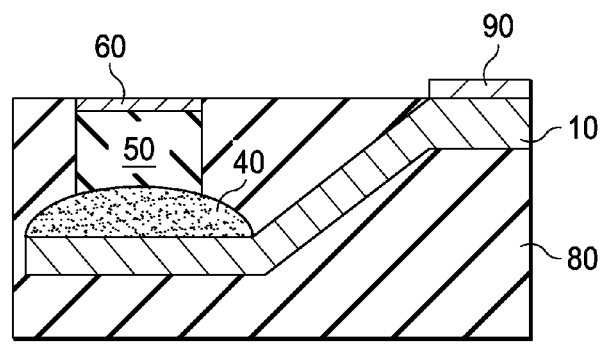
Figure 12B:
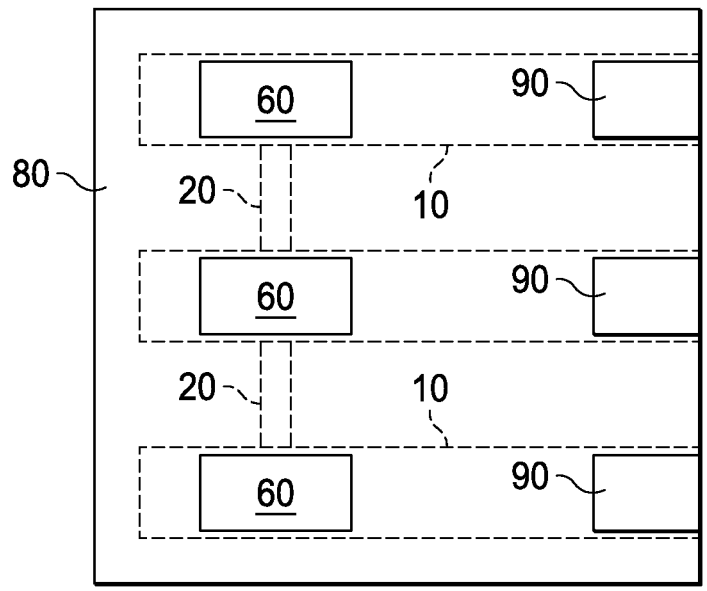

FIG. 12, which includes FIGS. 12A and 12B, illustrates a semiconductor package mounted over a clip frame in accordance with an alternative embodiment of the present invention, wherein FIG. 12A illustrates a cross-sectional view and FIG. 12B illustrates a top view.

This embodiment illustrates a semiconductor package having more than one die 50 and formed over a plurality of clips 10. Instead of dicing adjacent support beams 20, in some embodiments, a larger package may be fabricated having more than one chip. Further, the support beams 20 may be used to electrically interconnect the dies on adjacent clips 10. For example, the back side of the dies 50 may be coupled to a ground plane in some embodiments. Similarly, in some embodiments, the dies 50 may comprise vertical devices such as vertical power transistors, which may be coupled together using the support beams 20. Thus, the support beams 20 may form part of the circuitry of the semiconductor package.

Figure 13:
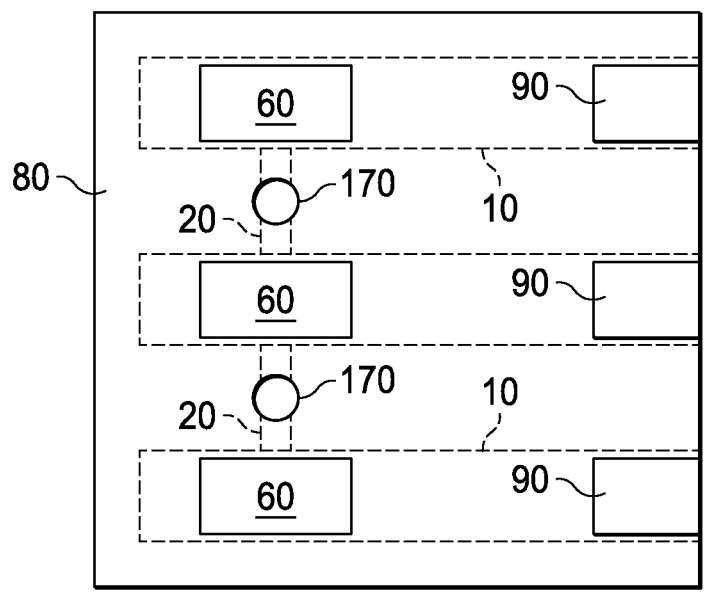
FIG. 13 illustrates a semiconductor package having a plurality of dies mounted over a clip frame but electrically isolated from each other in accordance with an alternative embodiment of the present invention.

FIG. 13 illustrates a semiconductor package having a plurality of dies mounted over a clip frame but electrically isolated from each other in accordance with an alternative embodiment of the present invention.

Alternatively, in some embodiments, the dies 50 in adjacent clips 10 may be isolated by punching a hole 170, for example, during or immediately prior to singulation (FIG. 9). In various embodiments, the hole 170 may be a through hole. Alternatively, the hole 170 may be a partial opening that extends through the clip 10 but not the entire package. As the support beams 20 are now disconnected, adjacent clips 10 are electrically isolated from each other.

Figure 14A:
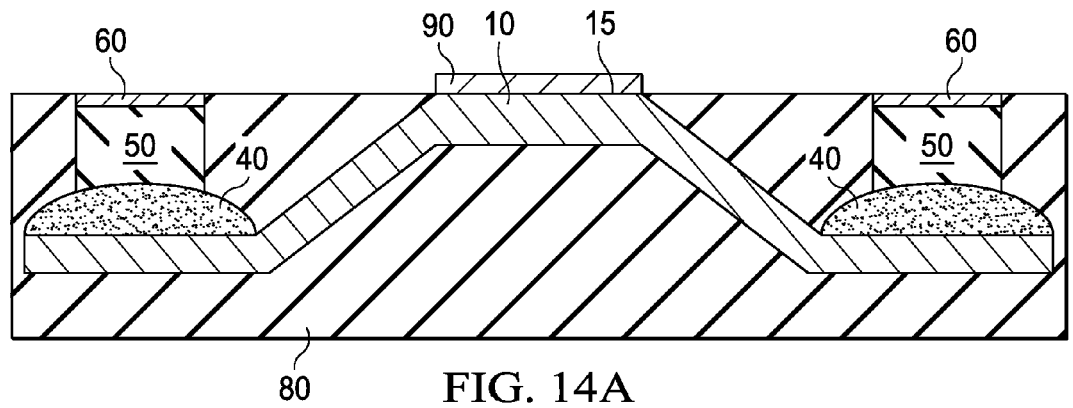
Figure 14B:
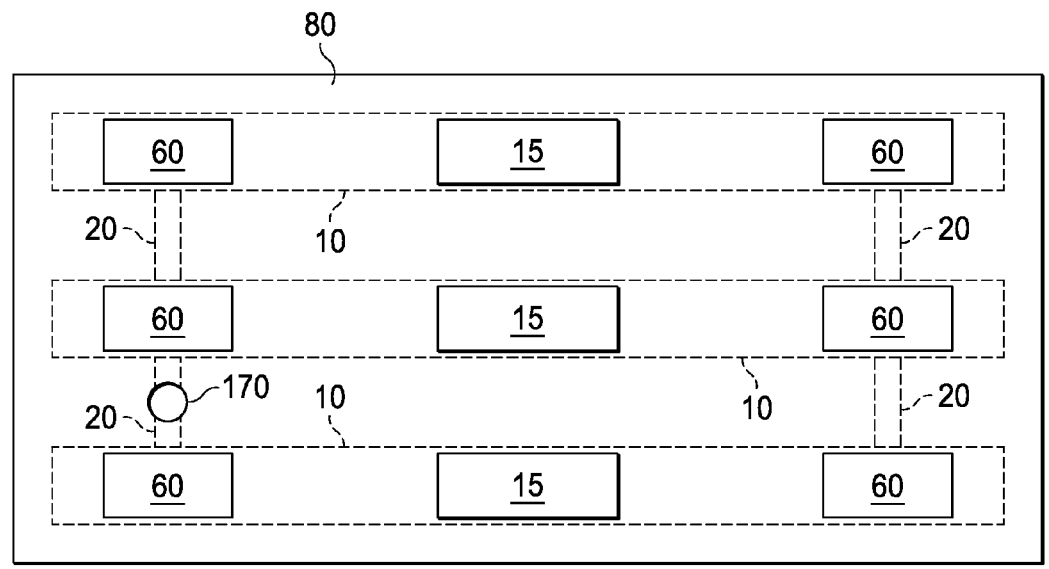

FIG. 14, which includes FIGS. 14A and 14B, illustrates a semiconductor package having a plurality of dies mounted over a clip frame during fabrication in accordance with an alternative embodiment of the present invention, wherein FIG. 14A illustrates a cross-sectional view and FIG. 14B illustrates a top view.

This embodiment is similar to the embodiment described in FIGS. 10-11. However, unlike this prior embodiment, the encapsulating material 80 covers both the dies 50 on either side of the clip 10. During singulation, the support beams 20 are punched or stamped using a stamping tool 160 as illustrated in FIG. 14B. Thus, a semiconductor package having two or more dies mounted on a single clip 10 is formed. The dies 50 may be coupled together through the clip 10 as illustrated in FIG. 14A.

Figure 15A:
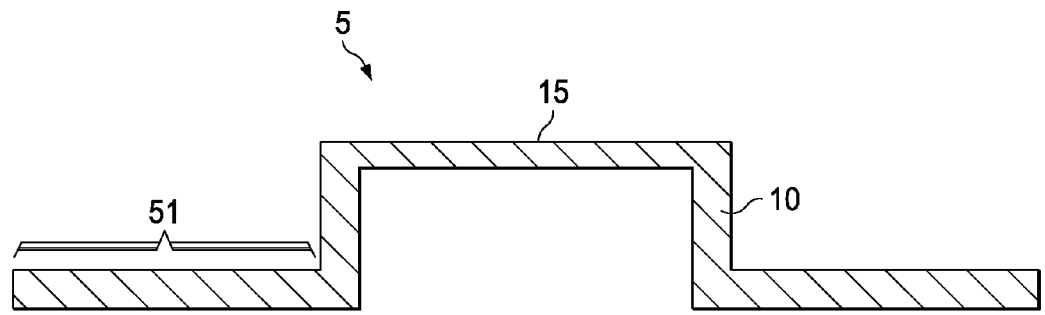
FIGS. 15A-15C, illustrates cross-sectional views of various designs of the clip frame that may be used in embodiments of the invention.
Figure 15B:
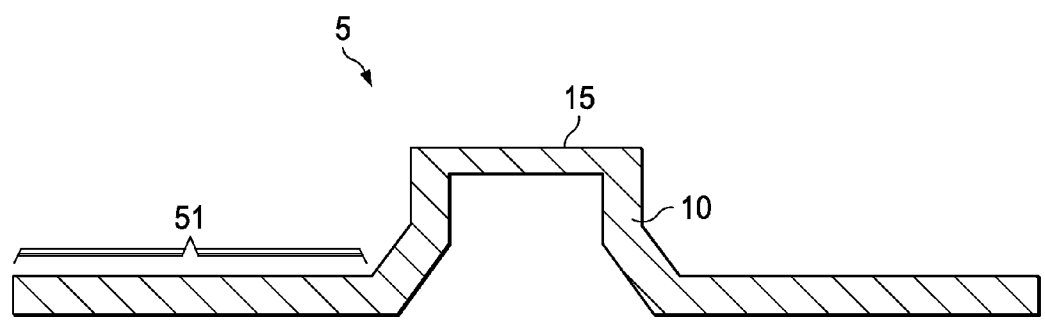
Figure 15C:
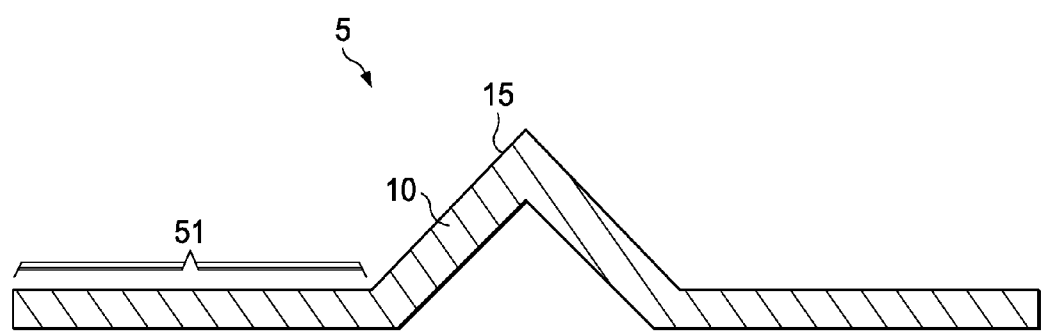

FIG. 15, which includes FIGS. 15A-15C, illustrates cross-sectional views of various designs of the clip frame that may be used in embodiments of the invention.

In one embodiment, the clip contact 15 and the support structure 51 may be coupled through an orthogonal portion as illustrated in FIG. 15A. In an alternative embodiment, the clip contact 15 and the support structure 51 may be coupled through an orthogonal portion and an inclined portion as illustrated in FIG. 15B. In yet another embodiment, the clip contact 15 may be formed by the intersection of two inclined portions portion as illustrated in FIG. 15C.

Figure 16A:
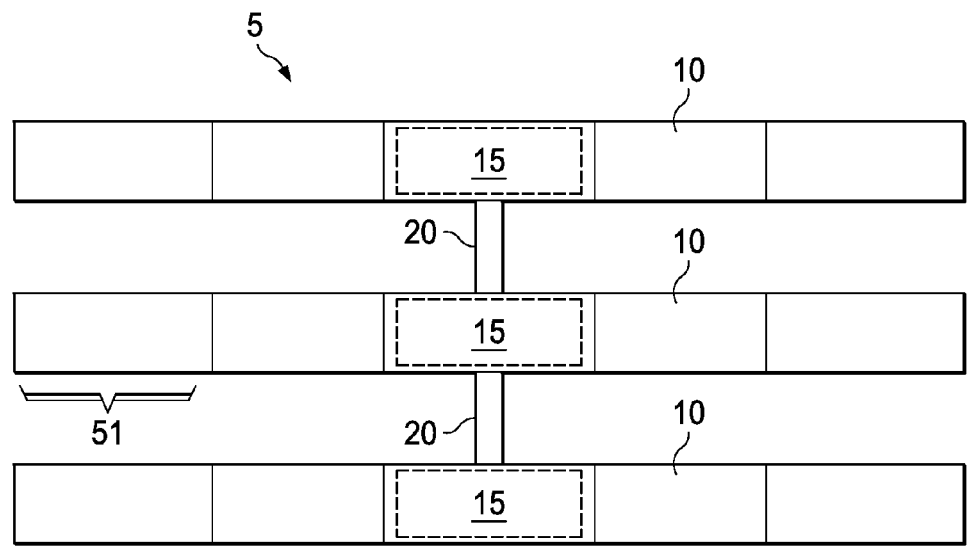
FIGS. 16A-16C, illustrates a top view of the clip frame with different configurations of the support beams in accordance with embodiments of the invention.
Figure 16B:
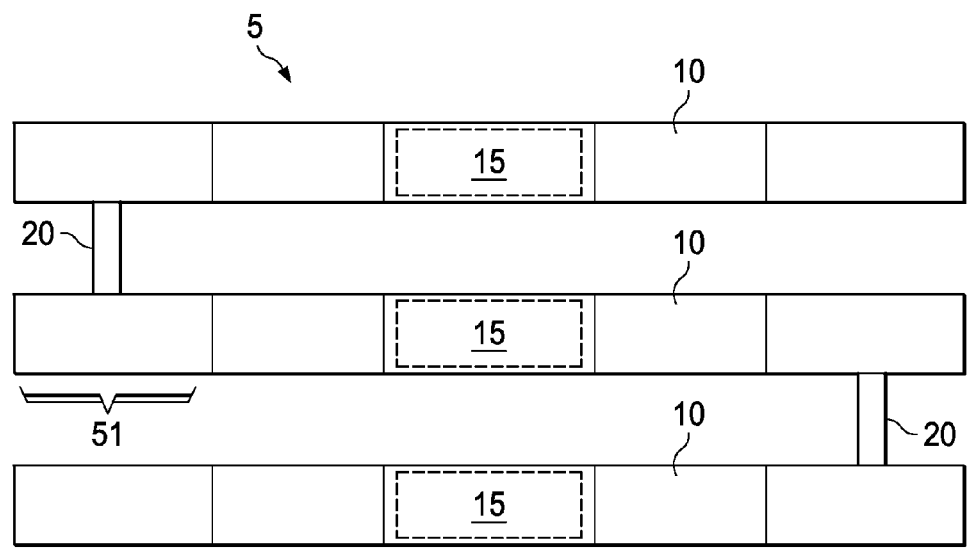
Figure 16C:
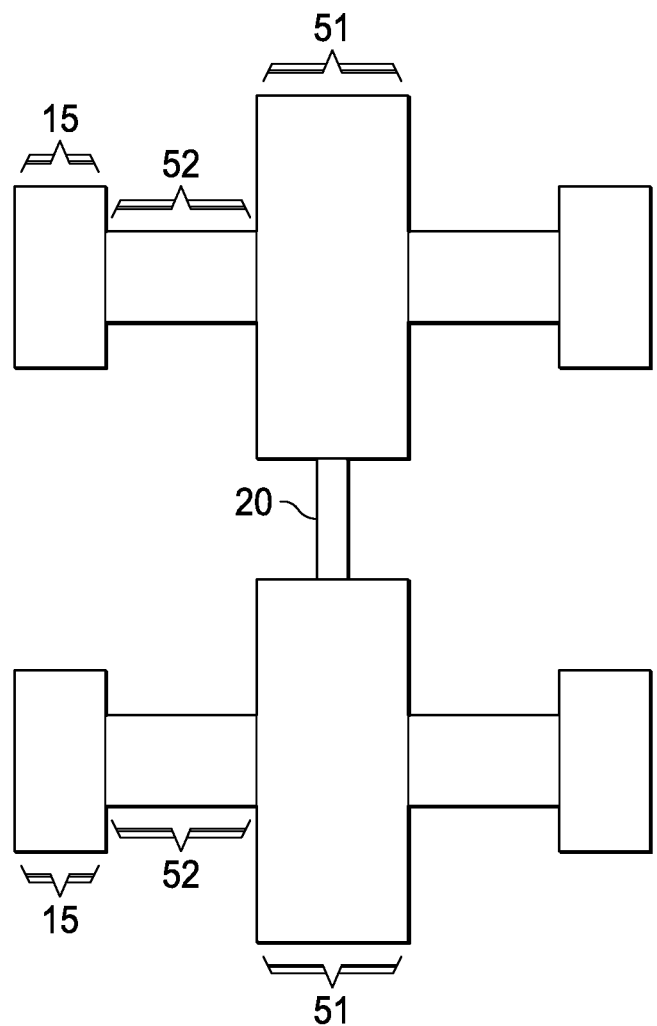

FIG. 16, which includes FIGS. 16A-16C, illustrates a top view of the clip frame with different configurations of the support beams in accordance with embodiments of the invention.

FIG. 16A illustrates an embodiment in which the support beams 20 are centrally located. Thus, a single sawing or singulation operation may be used to form individual package. For example, advantageously, the sawing may be performed in a single orientation and operation that separates two adjacent clips 10 to form four semiconductor packages.

FIG. 16B, illustrates an embodiment in which the support beams 20 are staggered. In other words, the support beams 20 are formed only between alternate clips 10 thus reducing the number of punching operations by half.

FIG. 16C illustrates an alternative embodiment of the invention in which the lever 52 connecting the support structure 51 with the contact portion 15 has smaller width. This allows the lever 52 to be more flexible during fabrication of the clip frame.

Further, in various embodiments, the contact portion 15 may have a different width from the width of the support structure 51.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1 may be combined with the embodiments described in FIGS. 12, 13, 14, 15, and/or 16. Similarly, the processes described in FIGS. 2-9, FIGS. 10-11, FIG. 13, and/or FIG. 14 may be combined. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor package, the method comprising:
    attaching a first die over a first clip of a clip frame, the first clip having a first support structure, a first lever, and a first contact portion, the first lever joining the first contact portion and the first support structure, wherein the clip frame comprises a plurality of clips arranged next to each other and oriented in a first direction and a plurality of support beams oriented in a second direction perpendicular to the first direction, wherein each of the plurality of clips is spaced apart from another of the plurality of clips by a gap of a plurality of gaps, and wherein each of the plurality of support beams connects neighboring clips of the plurality of clips separated by a gap of the plurality of gaps;
    encapsulating the first clip and the first die with an encapsulating material; and
    singulating the clip frame to form the semiconductor package, wherein after the singulating the first contact portion is disposed on a front side of the semiconductor package and the first support structure is adjacent an opposite back side of the semiconductor package, wherein the first clip is connected to an adjacent second clip through a support beam of the plurality of support beams, and wherein the singulating cuts through the support beam.

2. The method of claim 1, wherein the singulating comprising stamping.

3. The method of claim 1, wherein the singulating comprising sawing.

4. The method of claim 1, further comprising:
    attaching a second die over the first clip, the first clip further comprising a second support structure and a second lever, the second lever joining the first contact portion with the second support structure.

5. The method of claim 4, wherein the first die and the second die are part of the semiconductor package after the singulating.

6. The method of claim 1, further comprising:
    attaching a second die over a second clip, the second clip comprising a second support structure, a second lever, and a second contact portion, the second lever joining the second contact portion with the second support structure.

7. The method of claim 6, wherein the first die and the second die are part of the semiconductor package after the singulating.

8. The method of claim 6, wherein after the singulating the second support structure is adjacent the back side of the semiconductor package and the second contact portion is disposed on the front side of the semiconductor package.

9. The method of claim 1, wherein encapsulating the first clip and the first die comprises forming patterns of the encapsulating material.

10. The method of claim 1, further comprising plating the first contact portion after encapsulating the first clip and the first die.

11. A method of forming a semiconductor package, the method comprising:
providing a first die having a bottom side and a front side with first die contacts;
attaching the bottom side of the first die over a first clip of a clip frame, the first clip having a first support structure, a first lever, and a first contact portion, wherein the first lever connects the first contact portion with the first support structure, wherein the clip frame comprises a plurality of clips arranged next to each other and oriented in a first direction and a plurality of support beams oriented in a second direction perpendicular to the first direction, wherein each of the plurality of clips is spaced apart from another of the plurality of clips by a gap of a plurality of gaps, and wherein each of the plurality of support beams connects neighboring clips of the plurality of clips separated by a gap of the plurality of gaps;
placing the clip frame with the first die over a carrier such that the front side of the first die and the first contact portion contact the carrier;
encapsulating the first clip and the first die with an encapsulating material extending from the front side of the first die and covering the first support structure;
curing the encapsulating material to form a package body; and
separating the package body from the carrier to expose a surface of the first contact portion and a surface of the first die contacts of the first die, wherein the first clip is connected to an adjacent second clip through a support beam of the plurality of support beams, and wherein a singulating process cuts through the support beam of the plurality of support beams.

12. The method of claim 11, wherein the first contact portion is at a first vertical distance from the first support structure, wherein the front side of the first die is at a second vertical distance from the first support structure, and wherein the first vertical distance is about the same as the second vertical distance.

13. The method of claim 12, wherein the first contact portion is laterally spaced from the front side of the first die.

14. The method of claim 11, further comprising:
plating the exposed surface of the first contact portion to form protruding first contacts; and
wherein the singulating process forms the semiconductor package.

15. The method of claim 11, wherein after the separating the first contact portion is disposed on a front side of the semiconductor package and the first support structure is adjacent an opposite back side of the semiconductor package.

16. The method of claim 11, wherein the clip frame comprises copper.

17. The method of claim 11, wherein the clip frame comprises a conductive material.

18. The method of claim 11, further comprising:
providing a second die having a bottom side and a front side having second die contacts; and
attaching the bottom side of the second die over the first clip, the first clip further comprising a second support structure and a second lever, the second lever joining the first contact portion with the second support structure.

19. The method of claim 18, further comprising singulating the clip frame to form the semiconductor package, wherein the first die and the second die are part of the semiconductor package after the singulating process.

20. The method of claim 11, further comprising:
providing a second die having a bottom side and a front side having second die contacts;
attaching the bottom side of the second die over a second clip, the second clip comprising a second support structure, a second lever, and a second contact portion, the second lever joining the second contact portion with the second support structure; and
wherein the singulating process forms the semiconductor package, wherein the first die and the second die are part of the semiconductor package after the singulating process.

21. A method of forming a semiconductor package, the method comprising:
providing a clip frame comprising a plurality of clips arranged next to each other and oriented in a first direction and a plurality of support beams oriented in a second direction perpendicular to the first direction, wherein each of the plurality of clips is spaced apart from another of the plurality of clips by a gap of a plurality of gaps, and wherein each of the plurality of support beams connects neighboring clips of the plurality of clips separated by a gap of the plurality of gaps, wherein the plurality of clips comprise
a first clip comprising a first support structure, a first lever, and a first contact portion, the first lever joining the first contact portion and the first support structure, the first contact portion being disposed on a front side of the semiconductor package, and the first support structure being adjacent an opposite back side of the semiconductor package, and
a second clip disposed adjacent the first clip and being supported by one of the plurality of support beams, the second clip comprising a second support structure, a second lever, and a second contact portion, the second lever joining the second contact portion and the second support structure, the second contact portion being disposed on the front side of the semiconductor package, and the second support structure being adjacent the back side of the semiconductor package; and
sawing a support beam of the plurality of support beams connecting the first clip and the second clip.

22. A method of forming a semiconductor package, the method comprising:
providing a clip frame comprising a plurality of clips arranged next to each other and oriented in a first direction and a plurality of support beams oriented in a second direction perpendicular to the first direction, wherein each of the plurality of clips is spaced apart from another of the plurality of clips by a gap of a plurality of gaps, and wherein each of the plurality of support beams connects neighboring clips of the plurality of clips separated by a gap of the plurality of gaps, wherein the plurality of clips comprise
a first clip comprising a first support structure, a first lever, and a first contact portion, the first lever joining the first contact portion and the first support structure, the first contact portion being disposed on a front side of the semiconductor package, and the first support structure being adjacent an opposite back side of the semiconductor package, a second clip disposed adjacent the first clip and being supported by one of the plurality of support beams, the second clip comprising a second support structure, a second lever, and a second contact portion, the second lever joining the second contact portion and the second support structure, the second contact portion being disposed on the front side of the semiconductor package, and the second support structure being adjacent the back side of the semiconductor package; and sawing a support beam of the plurality of support beams.

23. A method of forming a semiconductor package, the method comprising:

providing a clip frame comprising a first clip having a first support structure, a first lever, and a first contact portion, the first lever joining the first contact portion and the first support structure, the first contact portion being disposed on a front side of the semiconductor package, and the first support structure being adjacent an opposite back side of the semiconductor package, wherein the clip frame comprises a plurality of clips arranged next to each other and oriented in a first direction and a plurality of support beams oriented in a second direction perpendicular to the first direction;

forming a first die over the first support structure of the first clip, the first die having a first contact pad on the front side of the semiconductor package;

forming an encapsulant material surrounding the first die and the first clip;

forming a second die over a second support structure of a second clip of the clip frame and embedded in the encapsulant material; and forming a hole in a support beam of the plurality of support beams isolating the first clip from the second clip.

24. The method of claim 23, wherein each of the plurality of clips is spaced apart from another of the plurality of clips by a gap of a plurality of gaps, and wherein each of the plurality of support beams connects neighboring clips of the plurality of clips separated by a gap of the plurality of gaps.

25. The method of claim 24, wherein the second clip further comprises a second lever and a second contact portion, the second support structure being adjacent the back side of the semiconductor package, the second contact portion being formed on the front side of the semiconductor package, the second lever joining the second contact portion and the second support structure.

26. The method of claim 23, orienting the first lever at an acute angle relative to the first support structure in a cross-sectional view.

27. The method of claim 23, further comprising sawing a support beam of the plurality of support beams oriented perpendicular to the first clip.

28. A method of forming a semiconductor package, the method comprising:

providing a clip frame comprising a first clip having a first support structure, a first lever, and a first contact portion, the first lever joining the first contact portion and the first support structure, the first contact portion being disposed on a front side of the semiconductor package, and the first support structure being adjacent an opposite back side of the semiconductor package, wherein the clip frame comprises a plurality of clips arranged next to each other and oriented in a first direction and a plurality of support beams oriented in a second direction perpendicular to the first direction wherein each of the plurality of clips is spaced apart from another of the plurality of clips by a gap of a plurality of gaps, and wherein each of the plurality of support beams connects neighboring clips of the plurality of clips separated by a gap of the plurality of gaps;

forming a first die over the first support structure of the first clip, the first die having a first contact pad on the front side of the semiconductor package;

forming an encapsulant material surrounding the first die and the first clip; and sawing a support beam of the plurality of support beams oriented perpendicular to the first clip.

29. The method of claim 28, further comprising orienting the first lever at an acute angle relative to the first support structure in a cross-sectional view.

30. The method of claim 28, further comprising:

forming a second die over a second support structure of the first clip and embedded in the encapsulant material, the first clip further comprising a second lever, the second support structure being adjacent the back side of the semiconductor package, the second lever joining the first contact portion and the second support structure.

* * * * *